(12) United States Patent
Vischer

(10) Patent No.: US 7,120,995 B2
(45) Date of Patent: Oct. 17, 2006

(54) APPARATUS FOR MOUNTING SEMICONDUCTORS

(75) Inventor: Dieter Vischer, Zug (CH)

(73) Assignee: ESEC Trading SA, Cham (CH)

( * ) Notice: Subject to any disclaimer, the term of this patent is extended or adjusted under 35 U.S.C. 154(b) by 169 days.

(21) Appl. No.: 10/861,720

(22) Filed: Jun. 3, 2004

(65) Prior Publication Data

US 2004/0246794 A1 Dec. 9, 2004

(30) Foreign Application Priority Data

Jun. 6, 2003 (CH) .............................. 2003 1006/03

(51) Int. Cl.
B23P 19/00 (2006.01)
H02K 41/02 (2006.01)
H05K 3/30 (2006.01)
B65G 1/12 (2006.01)

(52) U.S. Cl. ............................. 29/740; 29/741; 29/743; 29/832; 29/833; 29/834; 74/490.07; 74/490.09; 310/12; 310/15; 414/222.12; 414/749.1; 414/751.1

(58) Field of Classification Search ................. 29/739, 29/740, 743, 759, 744, 719, 833, 832, 834, 29/742; 414/222.12, 749.1, 751.1; 250/491.1, 250/492.1, 492.2; 901/16; 74/479.01, 490.08, 74/490.09, 471 XY; 310/12, 13–15, 17
See application file for complete search history.

(56) References Cited

U.S. PATENT DOCUMENTS

| 4,758,750 A * | 7/1988 | Itagaki et al. .................. 310/13 |
| 5,351,872 A | 10/1994 | Kobayashi .................. 228/6.2 |
| 5,876,556 A * | 3/1999 | Takanami .................. 156/556 |
| 6,171,049 B1 | 1/2001 | Wirz et al. .................. 414/680 |
| 6,185,815 B1 | 2/2001 | Schindler .................. 29/740 |
| 6,513,233 B1 * | 2/2003 | Nakao et al. .................. 29/740 |
| 6,579,057 B1 * | 6/2003 | Mimata et al. ............. 414/627 |
| 6,798,088 B1 * | 9/2004 | Hsu et al. .................. 310/12 |
| 6,851,914 B1 * | 2/2005 | Hirata .................. 414/627 |
| 6,930,412 B1 * | 8/2005 | Chang et al. .................. 310/12 |
| 2002/0152619 A1 | 10/2002 | Ito et al. .................. 33/1 M |
| 2003/0101576 A1 | 6/2003 | Hartmann .................. 29/740 |

FOREIGN PATENT DOCUMENTS

| DE | 39 38 088 | 11/1989 |
| EP | 877544 | 4/1998 |
| EP | 0991110 | 10/1998 |

OTHER PUBLICATIONS

European International Search Report, CH 10062003, dated Sep. 23, 2003.

* cited by examiner

Primary Examiner—Peter Vo
Assistant Examiner—Livius Radu Cazan
(74) Attorney, Agent, or Firm—Thelen Reid & Priest LLP; David B. Ritchie

(57) ABSTRACT

An apparatus for mounting semiconductors contains a bonding station, whereby the bonding station comprises a wafer table for presenting the semiconductor chips, a substrate table and a pick and place system with a bondhead with a chip gripper. Part of the wafer table is located underneath the substrate table. The pick and place system has a first linear motor that comprises a rigidly arranged stator and a shuttle that can be moved in a first direction guided by first guide elements, and a second linear motor that comprises a rigidly arranged stator and a shuttle that can be moved in a second direction. The shuttle of the first linear motor has second guide elements that guide the shuttle of the second linear motor. The bondhead with the chip gripper is arranged on the shuttle of the second linear motor.

4 Claims, 3 Drawing Sheets

APPARATUS FOR MOUNTING SEMICONDUCTORS

PRIORITY CLAIM

The present application claims priority under 35 U.S.C § 119 based upon Swiss Patent Application No. 2003 1006/03 filed on Jun. 6, 2003.

FIELD OF THE INVENTION

The invention concerns an apparatus for mounting semiconductors on a substrate.

An apparatus for mounting semiconductors of this type is known in the art as a die bonder. It serves to mount the numerous, uniform chips of a wafer that are located next to each other on a carrier, mostly a tape, one after the other onto a substrate, e.g., a metallic leadframe. Co-ordinated with each pick and place movement of a chip gripper, a wafer table on which the chip carrier is located presents a next chip at a first location and the substrate is transported likewise in order to present a new substrate position at a second location. In order to pick and subsequently place the chip, the chip gripper can be raised and lowered either together with the entire pick and place system or independently in relation to the pick and place system.

Extremely high demands are placed on an apparatus for mounting semiconductors of this type. For the further processing of the mounted chips, they must be accurately positioned on the substrate which demands a correspondingly accurate reaching of the second location by the chip gripper and already demands the accurate reaching of the first location for picking the chip. On the other hand, high speed and short cycle times are required through which correspondingly high accelerations and forces of inertia occur at the moved parts.

Up to now, in order to produce the alternating movements of the chip gripper, various lever mechanisms have been applied some of which include crank guides. Because of the substantial lateral forces occurring at them, guides of this type are unfavourable for a precise movement process and have to be appropriately maintained. With another known mechanism, the chip gripper sits at the end of a lever that swivels back and forth, ie, it makes an arc-shaped movement corresponding to the swivel deflections of the lever each of which has to be stopped in the end positions whereby a strong tendency to oscillation exists. A disadvantage of such lever-operated mechanisms lies in that they only allow transport of the chip along a fixed, predetermined path from a location A to a location B. pick and place systems with lever mechanisms are known for example from the patent documents EP 877'544, U.S. Pat. Nos. 6,185,815 and 6,171,049.

Pick and place systems are also known with which the chip gripper is driven by means of a toothed belt. The disadvantage here is the great inaccuracy in placing the chip onto the substrate.

A pick and place system with a linear motor is known from EP 991'110 with which the semiconductor chips can be picked from the wafer table at different locations. In height, the linear motor is generously built so that the chip gripper can be lowered for picking and placing a semiconductor chip.

On the one hand, in order to be able to mount the semiconductor chips quickly and accurately, the distance between the pick location and the mounting location should be short and, on the other hand, the mechanical construction should be simple. The pick and place system of U.S. Pat. No. 6,185,815 is indeed a simple and robust construction that enables a precise placing of the semiconductor chip onto the substrate but has the disadvantage that the space requirement continues to increase as the diameter of the wafers continues to increase. The equally known solution with which the substrate table and the wafer table are arranged one above the other has the disadvantage that, from the pick location to the mounting location, a large difference in height has to be overcome.

The pick and place system known from U.S. Pat. No. 6,171,049 with which the wafer table is arranged orthogonally to the substrate table has the disadvantage that occasionally semiconductor chips that stick to the foil fall down and that the foil distorts as the result of the force of gravity acting upon the semiconductor chips so that the position of the semiconductor chip to be picked changes unintentionally. Furthermore, it can happen that now and then the foil inclines out of the vertical plane. In doing so, the corners or edges of neighboring semiconductor chips that are only separated by small saw cuts could come into contact. In the worst case, such contacts can lead to corners or edges of the semiconductor chips breaking off which is known in the art as "Chipping".

BRIEF DESCRIPTION OF THE INVENTION

The object of the invention is to develop a die bonder with which the distance between the pick location and the mounting location of the semiconductor chip is short but which does not have the above-mentioned disadvantages.

An apparatus for mounting semiconductors contains a bonding station whereby the bonding station comprises a wafer table for presenting the semiconductor chips, a substrate table and a pick and place system with a bondhead with a chip gripper. Part of the wafer table is located and finds place underneath the substrate table. The pick and place system picks the semiconductor chips one after the other from the wafer table and places them onto the substrate. The substrates are transported in steps by a transport system in a transport direction. The pick and place system has a first linear motor that comprises a stationary stator and a shuttle that can be moved in a first direction guided by first guide elements, and a second linear motor that comprises a stationary stator and a shuttle that can be moved in a second direction. The shuttle of the first linear motor has second guide elements that guide the shuttle of the second linear motor. The bondhead with the chip gripper is arranged on the second shuttle.

The first guide elements are preferably integrated into the stator or the second linear motor. Furthermore, the pick and place system is preferably formed symmetrically in relation to a plane of symmetry running at right angles to the transport direction of the substrates. In particular, the stator of the second linear motor consists of two stator parts that are arranged on both sides of the bond point or bond points. This symmetrical design has the advantage that the bondhead is guided by two guide elements that are arranged on both sides of the bond point or bond points so that the bondhead exerts no torque on the guide elements either on picking the semiconductor chips from the wafer table or on placing the semiconductor chips onto the substrate.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF THE INVENTION

Figure 1:
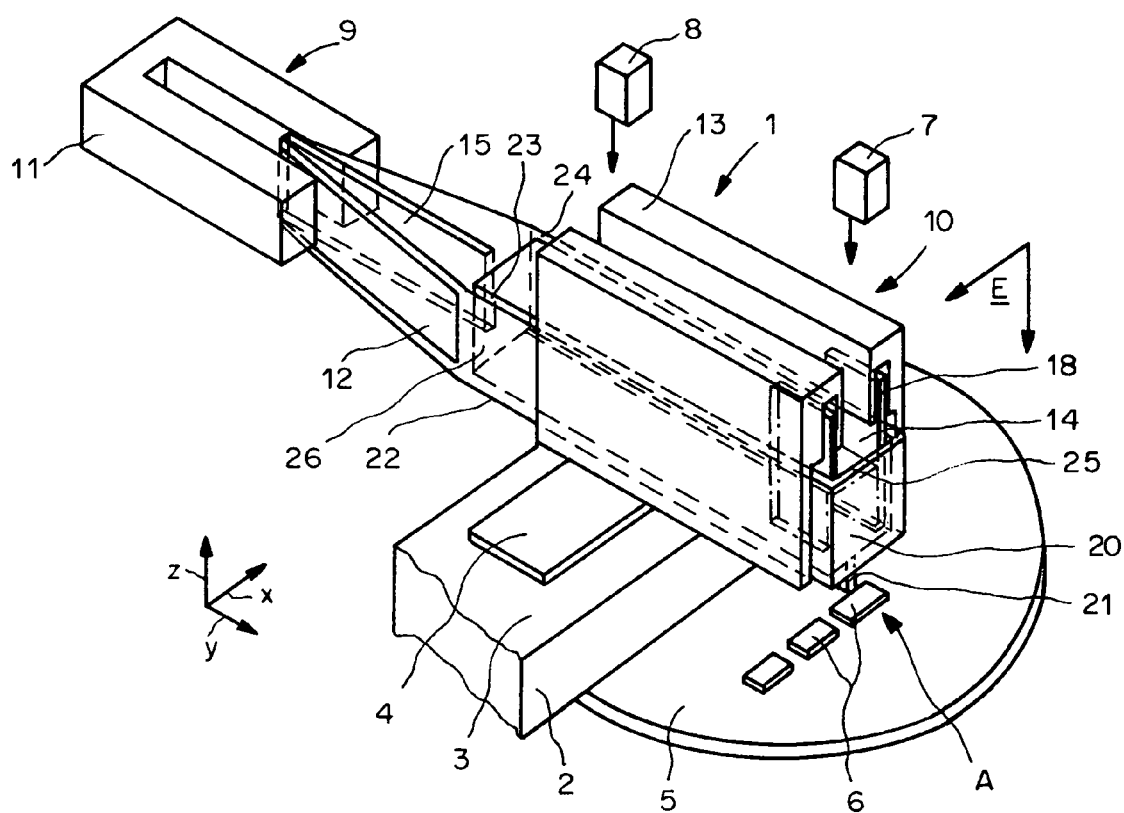
FIG. 1 shows a perspective view of a bonding station of a Die Bonder.

FIG. 1 shows schematically a perspective view of a bonding station of a die bonder that comprises a pick and place system 1, a substrate table 2 with a support surface 3 for substrates 4 and a wafer table 5 for presenting the semiconductor chips 6 (only three semiconductor chips are drawn) and two cameras 7 and 8 the optical axes of which are presented by arrows. The axes of a cartesian system of co-ordinates are marked with x, y and z. For better understanding of the invention, some of the edges of the pick and place system 1 that are hidden in this perspective view are presented with ghost lines. However, for reasons of illustrative clarity, not all hidden edges are presented. A not presented transport system transports the substrates 4 in steps in the x direction. The substrates 4 contain a number n of substrate places arranged next to each other on the substrate 4 in y direction for accepting one semiconductor chip 6 each. The pick and place system 1 picks the semiconductor chip 6 presented at location A from the wafer table 5, raises the picked semiconductor chip 6 in z direction above the level of the support surface 3 of the substrate table 2, transports the semiconductor chip 6 in the v direction to a location $B_k$, whereby the index k signifies an integer in the range of 1 to n, and places the semiconductor chip 6 onto the substrate 4. As far as possible, the transport movements in z direction and in y direction are combined with one another. The two cameras 7 and 8 serve to determine the position and orientation of the semiconductor chip 6 presented at location A and the position and orientation of the substrate place at location $B_k$, so that the semiconductor chip 6 can be accurately positioned onto the substrate 4. Part of the wafer table 5 is located underneath the substrate table 2 whereby the pick location A is close to the edge of the substrate table 2 so that the transport distance in y direction is as short as possible.

The pick and place system 1 comprises two linear motors 9 and 10. The first linear motor 9 consists of a stationary stator 11 and a shuttle 12 that can be moved in y direction. The second linear motor 10 consists of a stationary stator 13 and a shuttle 14 that can be moved in z direction. The shuttle 12 of the first linear motor 9 has a first coil body 15 that acts in combination with the magnets of the first stator 11. The first linear motor 9 is preferably an electromagnetic three-phase motor built with customary technology. The movement of the first shuttle 12 in y direction is guided by first guide elements 16 (FIG. 2) that are preferably integrated into the stator 13 of the second linear motor 10. The shuttle 12 of the first linear motor 9 has second guide elements 17 (FIG. 2) that guide the second shuttle 14 of the second linear motor 10. When the first linear motor 9 moves the first shuttle 12 back and forth in y direction, then the first shuttle 12 takes the second shuttle 14 with it. The second shuttle 14 has a second coil body 18 that acts in combination with the magnets 19 (FIG. 2) of the second stator 13. The second linear motor 10 moves the second shuttle 14 up and down in z direction. A bondhead 20 with a chip gripper 21 is arranged on the second shuttle 14. The chin gripper 21 can be moved in z direction in relation to the bondhead 20 whereby the movement of the chip gripper 21 occurs in a known way, for example pneumatically. In addition, the chip gripper 21 can be rotated on an axis running in z direction so that the turning position of the picked semiconductor chip can be corrected before placing it onto the substrate 4 based on the images delivered by the two cameras 7 and 8. With this embodiment, the pick and place system 1 is formed symmetrically in relation to the x direction so that on placing the semiconductor chip onto the substrate 4 no torque is exerted on the bondhead 20.

The first shuttle 12 comprises a rectangular frame 22 with two walls 23 and 24 running in y direction that are connected by transverse walls 25 and 26. Assigned parts of a position measuring system for measuring the z position of the bondhead 20 or the chip gripper 21 are arranged on the bondhead 20 (or on the chip gripper 21) as well as on the transverse wall 25. Such a position measuring system preferably consists of a metal or glass rule and a reading head. The guide elements 16 (FIG. 2) run along the second stator 13 parallel to the walls 23 and 24 of the shuttle 12.

Figure 2:
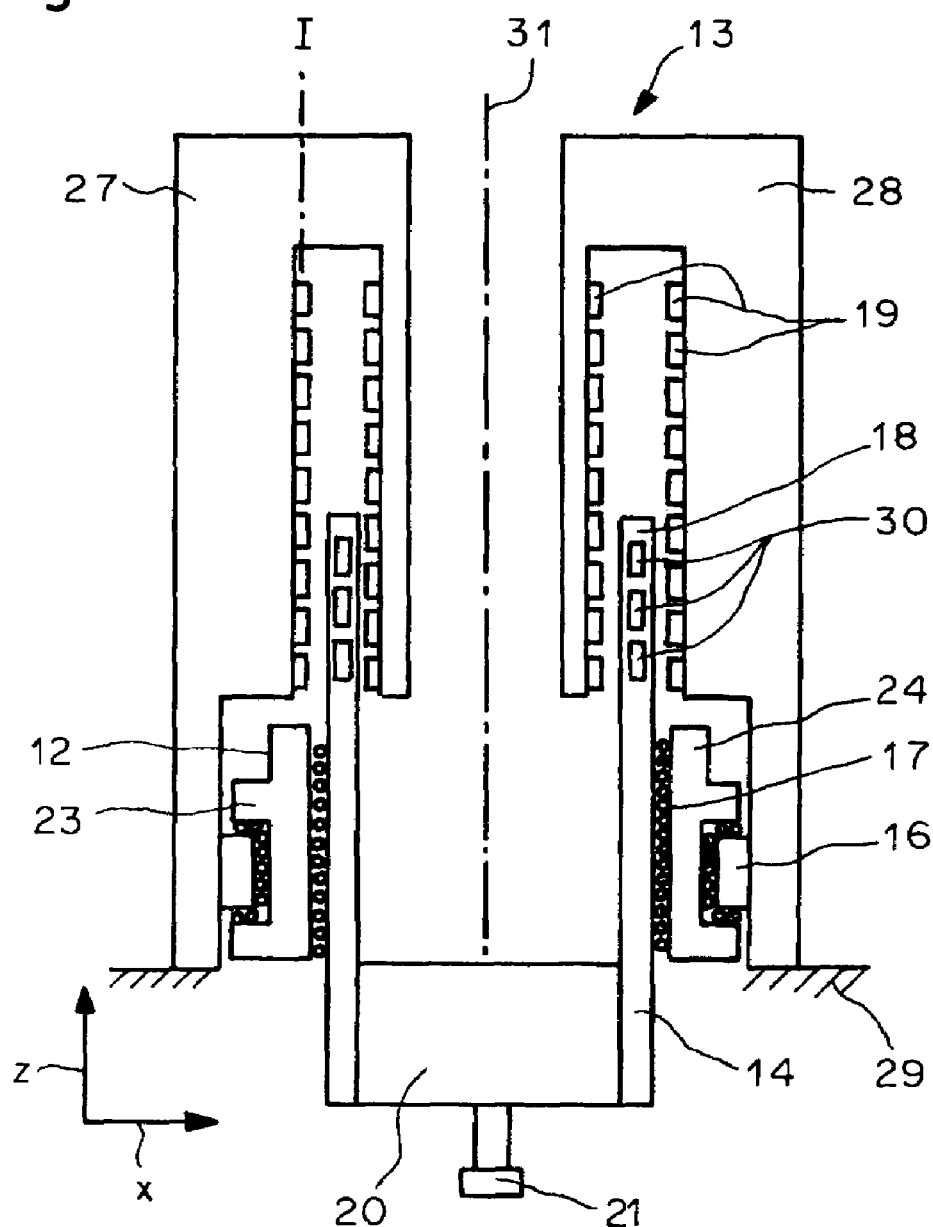
FIG. 2 shows a section through a plane marked with the reference sign E in FIG. 1.

FIG. 2 shows the pick and place system in a section through a plane marked with the reference sign E in FIG. 1. The second stator 13 consists of two separate stator parts 27 and 28 that extend in y direction, ie, are formed with a certain abundant length n y direction, so that the second shuttle 14 can be moved up and down in z direction regardless of its y position. The walls 23 and 24 of the first shuttle 12 (FIG. 1) are guided in y direction by the guide elements 16 integrated into the stator parts 27 and 28 or mounted onto a base 29. The second guide elements 17 for guiding the second shuttle 14 in relation to the z direction are secured to the walls 23 and 24 so that the first shuttle 12 takes the second shuttle 14 with it in y direction. The stator parts 27 and 28 have magnets 19 extending in y direction between which an air gap is formed. The second coil bodies 18 of the second shuttle 14 protrude into this air gap. In the example, the second linear motor 10 is a three-phase electromagnetic drive: Each of the coil bodies 18 has three coils 30 whereby each of the three electrical phases is allocated to one coil.

Figure 3:
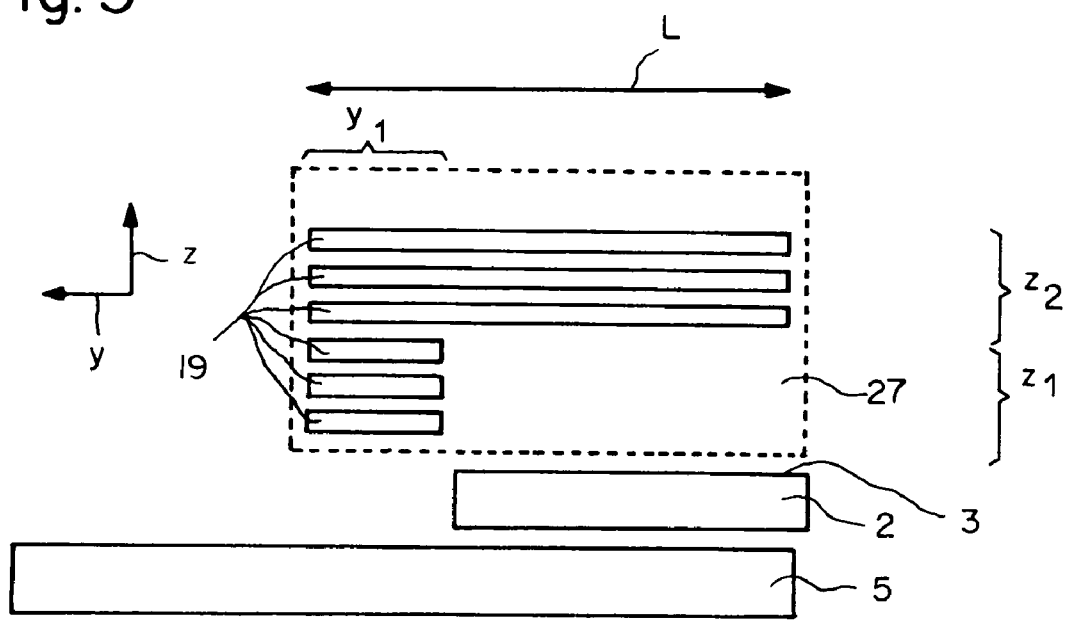
FIG. 3 shows a section along the line I—I in FIG. 2, and FIG. 4 two shuttles movable relative to each other.

FIG. 3 shows the stator part 27 and the substrate table 2 according to a section along line I—I of FIG. 2. Preferably, the magnets 19 in the stator part 27 extend only so far in v direction as is necessary for the movement of the second shuttle 14 (FIG. 2) in z direction. The movement range of the second shuttle 14 in z-direction is divided into two areas $Z_1$ and $Z_2$. In area $Z_1$ the magnets 19 only extend over a comparably short area marked with $Y_1$. In area $Z_2$ however, the magnets 19 extend over the entire length L of the stator part 27. The area $Y_1$ designates the area beside the substrate table 2, ie, the area in which the bondhead 20 (FIG. 2) or the chip gripper 21 (FIG. 2) has to be lowered below the level of the support surface 3 of the substrate table 2 to the level of the wafer table 5.

Figure 4:
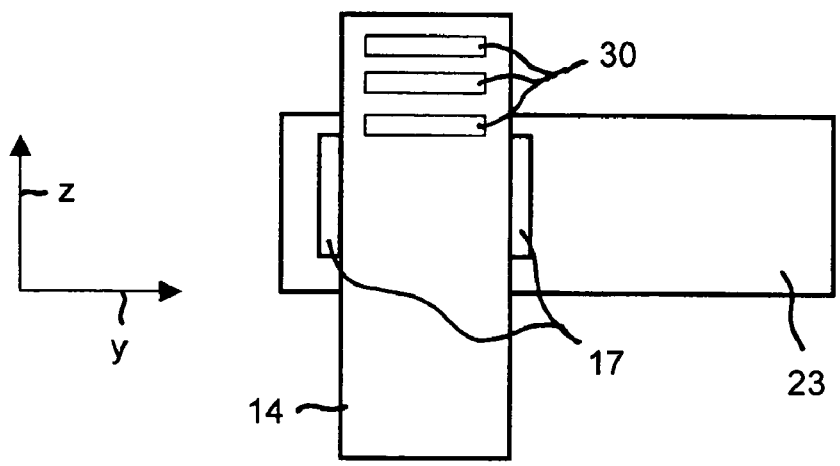

FIG. 4 shows the wall 23 of the first shuttle 12 as seen from a plane of symmetry 31 (FIG. 2). The guide elements 17 for guiding the second shuttle 14 are secured to the wall 23 and enable the movement of the second shuttle 14 in z-direction.

Essentially, the embodiment described based on FIGS. 1 to 3 is formed symmetrically in relation to a plane of symmetry 31 (FIG. 2) running in y direction. This symmetrical design has the advantage that the bondhead 20 is guided by two guide elements 17 that are arranged on both sides of the bond point or bond points so that the bondhead 20 exerts no torque on the guide elements 17 either on picking the semiconductor chip from the wafer table or on placing the semiconductor chip onto the substrate. However it is also possible to design a pick and place system without this named symmetry. Such a solution exists for example in that the shuttle 12, instead of the frame 22 (FIG. 1), only contains one single wall 23 and that the second linear motor 10 contains only one single stator part, namely the stator part 27, whereby the number of guide elements 16 and 17 is also reduced correspondingly.

With a further embodiment, the first guide elements 16 for guiding the shuttle 12 are not arranged stationary but can be moved for minor correction movements within a range of typically ±0.5 mm in the x direction, i.e., in the transport direction of the substrate 4, by means of a drive. The stators 11 and 13 are nevertheless arranged to be stationary. The air gap formed between the magnets of the stator 11 is dimensioned so wide in x-direction that, during correction movements, the coil body 15 arranged on the shuttle 12 under no circumstances touches the magnets of the stator 11. Or, the linear motor 9 shown in FIG. 1 is mounted turned by 90° in relation to its drive axis so that the coil body 15 is aligned horizontally and the coils of the coil body 15 are formed in such a way that the drive force produced is independent of the x position of the guide elements 16. The air gaps formed between the magnets 19 of the stator 13 of the second linear motor 10 are dimensioned so wide that the coil bodies 18 arranged on the shuttle 14 likewise do not touch the magnets 19 of the stator 13 during the correction movements. Because the efficiency of the second linear motor 10 decreases with increased width of the air gap, the movement range of the guide elements 16 in x direction is kept as small as possible but as large as necessary.

Because the two linear motors 9 and 10 (FIG. 1) have to enable a comparatively large movement range, they are preferably three-phase electric motors. However, other types of electric linear motors can also be used as long as they can cover the necessary movement ranges.

Many different processes are known and there are also many designs of bondhead 20 and chip gripper 21 for picking the semiconductor chip from the wafer table 5 and for placing the picked semiconductor chip onto the substrate 4. As a selected example, the process known as overtravel is mentioned here with which the bondhead 20 is lowered until the chip gripper 21 is deflected in relation to the bondhead 20 whereby a predetermined pick force or bond force is produced on picking the semiconductor chip as well as on placing the semiconductor chip. A bondhead 20 with which the deflection of the chip gripper 21 in relation to the bondhead 20 is pneumatically controlled is known from the U.S. patent application U.S. 2003-0101576. Two operating modes are available for controlling the deflection of the chip gripper 21. In the first operating mode, the deflection of the chip gripper 21 or a value derived from it is controlled. In the second operating mode, a pressure difference is controlled that produces the pick or bond force to be applied by the chip gripper 21. The pick and place system 1 in accordance with the invention can be designed to work together with all these different, known bondheads.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting semiconductors, comprising
   a substrate table for supporting a substrate,
   a wafer table for presenting a semiconductor chip, whereby part of the wafer table is located underneath the substrate table, and
   a pick and place system for picking the semiconductor chip presented by the wafer table and placing the semiconductor chip onto the substrate, comprising
   a first shuttle,
   a second shuttle carrying a bondhead with a chip gripper,
   first guide elements for guiding the movement of the first shuttle along a first direction,
   second guide elements for guiding the movement of the second shuttle along a second direction, the second guide elements mounted on the first shuttle,
   a first linear motor comprising a first stationary stator and a first coil connected to the first shuttle, and
   a second linear motor comprising a second stationary stator and a second coil connected to the second shuttle.

2. The apparatus according to claim 1, wherein the first guide elements are integrated into the stator of the second linear motor.

3. The apparatus according to claim 2, wherein the stator of the second linear motor has two stator parts equipped with magnets.

4. The apparatus according to claim 1, wherein the stator of the second linear motor has two stator parts equipped with magnets.

* * * * *